(12) United States Patent
Mechnig

(10) Patent No.: US 7,561,087 B2
(45) Date of Patent: Jul. 14, 2009

(54) INTEGRATED CIRCUIT ARRANGEMENT COMPRISING AT LEAST ONE DIGITAL-ANALOGUE CONVERTER

(75) Inventor: Stephan Mechnig, Munich (DE)

(73) Assignee: National Semiconductor Germany AG, Unteraching (DE)

( * ) Notice: Subject to any disclaimer, the term of this patent is extended or adjusted under 35 U.S.C. 154(b) by 0 days.

(21) Appl. No.: 12/099,992

(22) Filed: Apr. 9, 2008

(65) Prior Publication Data
US 2008/0252501 A1    Oct. 16, 2008

(30) Foreign Application Priority Data
Apr. 13, 2007    (DE) .................. 10 2007 017 639

(51) Int. Cl.
*H03M 1/66* (2006.01)
(52) U.S. Cl. ...................... 341/144; 375/296
(58) Field of Classification Search ......... 341/130–144; 375/296, 350
See application file for complete search history.

(56) References Cited

U.S. PATENT DOCUMENTS 5,815,537 A    9/1998  Janssen 6,489,905 B1 *  12/2002  Lee et al. .................... 341/120
7,148,732 B2 *  12/2006  Kakuda et al. .............. 327/262
2002/0044076 A1  4/2002  Yao et al.
2008/0136694 A1 *  6/2008  Imai .......................... 341/144

FOREIGN PATENT DOCUMENTS

DE    10350594 A1    6/2005

\* cited by examiner

*Primary Examiner*—Lam T Mai
(74) *Attorney, Agent, or Firm*—Pearne & Gordon LLP

(57) ABSTRACT

The invention relates to an integrated circuit arrangement (10) comprising at least one digital-analogue converter (12) with a multitude of current-source transistors (N1-N8) arranged parallel to each other for providing current components (I1-I8) that in each case are predetermined in a fixed manner and are used to form an analogue current signal, wherein control inputs of the current-source transistors (N1-N8) can be subjected to a shared adjustment potential by way of an adjustment potential line (14), which adjustment potential defines the individual current components (I1-I8), and comprising an adjustment circuit (16) for providing the adjustment potential at the adjustment potential line (14). In order to drastically reduce interference, in particular noise, in the individual current components (I1-I8), the integrated circuit arrangement (10) comprises an external connection (18), which is connected to the adjustment potential line (14) for connecting an external capacitor (C0).

8 Claims, 2 Drawing Sheets

US 7,561,087 B2

INTEGRATED CIRCUIT ARRANGEMENT COMPRISING AT LEAST ONE DIGITAL-ANALOGUE CONVERTER

BACKGROUND OF THE INVENTION

The present invention relates to an integrated circuit arrangement comprising at least one digital-analogue converter.

1. Field of the Invention

In particular, the present invention relates to such arrangement comprising at least one digital-analogue converter with a multitude of current-source transistors arranged parallel to each other for providing current components that in each case are predetermined in a fixed manner and are used to form an analogue current signal, wherein control inputs of the current-source transistors can be subjected to a shared adjustment potential by way of an adjustment potential line, which adjustment potential defines the individual current components, and comprising an adjustment circuit for providing the adjustment potential at the adjustment potential line.

2. Description of the Prior Art

Such circuit arrangements and in particular the architecture of the digital-analogue converter or converters implemented therein, hereinafter abbreviated to "DAC", are known from prior art.

FIG. 1 shows some components of a conventional digital-analogue converter that are essential to understanding the present invention.

The part of the DAC shown in FIG. 1 comprises a multitude (in the present example 8) of FETs N1-N8 ("current-source transistors") arranged in parallel. During operation of the DAC the transistors N1-N8 are used to provide current components I1-I8 that are predetermined in a fixed manner and are used to form an analogue current signal. By means of a part of the DAC that is not shown in FIG. 1, these current components I1-I8, depending on the state of an input digital signal, contribute to an analogue current signal that is obtained by addition of the single current components. In this arrangement, switching a particular current component on and off can take place in a manner that is known per se by way of a switching transistor arranged in series with the respective current-source transistor. The current components actually selected by the digital signal contribute to the analogue output signal of the DAC, either directly by outputting a current signal, or indirectly by outputting a voltage signal that can, for example, be obtained in that the current signal is fed by way of a resistor element.

As shown in FIG. 1, the control inputs (presently gate connections) of the transistors N1-N8 are connected to each other and by way of a line connection, which hereinafter is designated an "adjustment potential line", are connected to the gate connection of a FET Nbias, which is switched in a way that is known per se as a current adjustment transistor, through which a predetermined reference current Ibias flows.

The arrangement shown thus implements a current mirror that mirrors the reference current Ibias that flows through the reference transistor Nbias to the multitude of current paths of the current source transistors N1-N8. The gate potential that arises based on the reference current Ibias at the transistor Nbias determines the values of the individual current components I1-I8 that contribute to the DAC output signal.

Any interference in the area of generating and transmitting this adjustment potential leads to corresponding interference, possibly even magnified, of the current components I1-I8 that in an ideal case are predetermined in a fixed manner. In this regard, for example, noise, e.g. thermal noise, in the reference current Ibias has a very disadvantageous effect on the current components I1-I8.

SUMMARY OF THE INVENTION

It is thus an object of the present invention to provide an integrated circuit arrangement of the type mentioned in the introduction, in which any interference in the individual current components (in particular noise) can be drastically reduced.

This object is met by an integrated circuit arrangement according to the invention. For the invention it is essential that the integrated circuit arrangement comprises an external connection that is connected to the adjustment potential line, for connecting an external capacitor. In this way the adjustment potential present at the adjustment potential line can be stabilised in a very effective manner so that in this way in turn the quality of the output signal of the DAC can be improved.

The invention makes it possible, in particular, to use an external capacitor with a relatively large capacitance as would be possible only with considerable difficulty, if at all, in the region of the integrated circuit arrangement itself.

In the context of the present invention the term "external capacitor" is to be interpreted in a wide sense; it comprises any arrangement that provides an electrical capacitance and that was not directly produced by means of the technology (e.g. CMOS technology) used in the production of the integrated circuit arrangement. This arrangement, referred to as an external capacitor, can, for example, be provided directly at an external connection of a semiconductor substrate or die, irrespective of whether the circuit arrangement is encased or non-encased. If the circuit arrangement is encased, for example if it is a chip package made according to a standard method, then the external capacitor can be arranged without any further ado within the casing (e.g. a sealing compound). However, in an alternative embodiment the "external connection" in the sense of the invention is a connection outside a casing of the integrated circuit arrangement, which connection is established in a way that is known per se, by way of a line connection (e.g. bond wires) to a pad of a semiconductor substrate.

The quality improvement of the DAC, which quality improvement can be achieved with the invention, advantageously makes it possible to implement novel integrated circuit arrangements whose circuit concepts have failed up to now as a result of the limited quality of the DAC contained therein. Such circuit arrangements or fields of application will be explained below.

In a preferred exemplary embodiment the integrated circuit arrangement further comprises a further external connection that is connected to a reference potential line of the integrated circuit arrangement. In this way any minor interference that is only caused by the electrical connection of an external capacitor to the integrated circuit arrangement can advantageously be reduced. The reference potential line can, for example, be a line at which a supply potential (or a potential derived therefrom) of the integrated circuit arrangement is present. Preferably, the reference potential line is connected to a channel connection of all the current-source transistors.

According to one embodiment, in a section of the adjustment potential line, which section leads from the adjustment circuit to the multitude of current-source transistors, a resistor element is arranged. This measure, too, is advantageous as far as interference reduction is concerned. The remaining sections of the adjustment potential line should be designed as far as possible to be low-resistance sections.

A first improvement of the invention provides for the integrated circuit arrangement to comprise a multitude of digital-analogue converters, each comprising a multitude of current-source transistors, wherein the adjustment circuit and the adjustment potential line are provided to be shared by the multitude of digital-analogue converters. In this way the capacitor arranged externally can at the same time advantageously improve the quality of a multitude of DACs.

A second improvement of the invention provides for the digital-analogue converter to be arranged in a feedback arrangement of a delta-sigma analogue-digital converter formed by the integrated circuit.

Generally speaking, in a delta-sigma analogue-digital converter the integrated ("sigma") difference ("delta") between an analogue input signal and an analogue presentation of the quantised digital output signal is fed to a quantiser (analogue-digital converter stage). In another embodiment of such a converter, in the narrower sense also designated a "delta modulator", the difference ("delta") between an analogue input signal and the integral ("sigma") of the quantised digital output signal is fed to the quantiser. By means of the feedback arrangement (comprising at least one DAC) the quantiser generates an output bit stream whose mean value over time follows that of the analogue input signal. When compared to a delta-sigma analogue-digital converter that operates in a time-discrete manner, a delta-sigma analogue-digital converter that operates in a time-continuous manner is generally associated with the advantage of lower power consumption, or in the case of predetermined power consumption with the advantage of greater signal bandwidth. The present invention is suitable for implementing digital-analogue converters in a feedback arrangement of any type of delta-sigma analogue-digital converters.

A particularly preferred combination of the two improvements of the invention explained above consists of the integrated circuit arrangement comprising a multitude of delta-sigma analogue-digital converters, in each case comprising at least one digital-analogue converter in a feedback arrangement of the delta-sigma analogue-digital converter, wherein the adjustment circuit and the adjustment potential line are provided to be shared by the multitude of digital-analogue converters.

The use of the invention to implement a DAC (or several DACs) which forms/form in turn part of an analogue-digital converter, hereinafter abbreviated to "ADC", consequently improves the quality of the ADC concerned. This fact makes it possible to implement a circuit concept that is extremely advantageous in practical application, which circuit concept consists of improving the accuracy of analogue-digital conversion by means of a redundant arrangement of several individual ADCs. In theory, for example, doubling of the number of ADCs operating in parallel should increase the signal-to-noise ratio (SNR) by 3 dB. However, this improvement only results in the case of non-correlated interference in which the interference amplitudes "add geometrically". In practical application such circuit concepts usually fail because the correlated instances of interference encountered in practical application add up in such a manner that in the end the SNR is not improved.

By suppressing, in particular, the correlated interference, this problem can be overcome. One embodiment provides, for example, for the multitude of delta-sigma analogue-digital converters to be provided for redundant analogue-digital conversion of a shared analogue input signal, and for digital output signals of the individual delta-sigma analogue-digital converters to be fed to a digital signal processing device of the integrated circuit arrangement. The digital signal processing device can, for example, be designed for averaging the digital signals obtained from the multitude of converters.

The quality of analogue-digital conversion that has been drastically improved as a result of the invention can advantageously be used in particular in the field of metrology in order to digitalise an analogue measuring signal with great accuracy. A special area of application, which in the context of the invention is particularly preferred, relates for example to the conversion and if applicable subsequent evaluation of analogue measuring signals that are provided by ultrasonic sensors (e.g. in devices relating to medical technology). In particular in this field of application the invention makes it possible to provide mixed-signal chips by means of which, with the use of a single integrated circuit arrangement, it is possible to implement not only precise analogue-digital conversion but also subsequent digital signal processing. This is of interest in particular in the case of radar applications (e.g. ultrasonic radar).

BRIEF DESCRIPTION OF THE DRAWINGS

Below, the invention is described in more detail with reference to exemplary embodiments as shown in the enclosed drawings. The following are shown.

DESCRIPTION OF THE PREFERRED EMBODIMENT(S)

Figure 2:
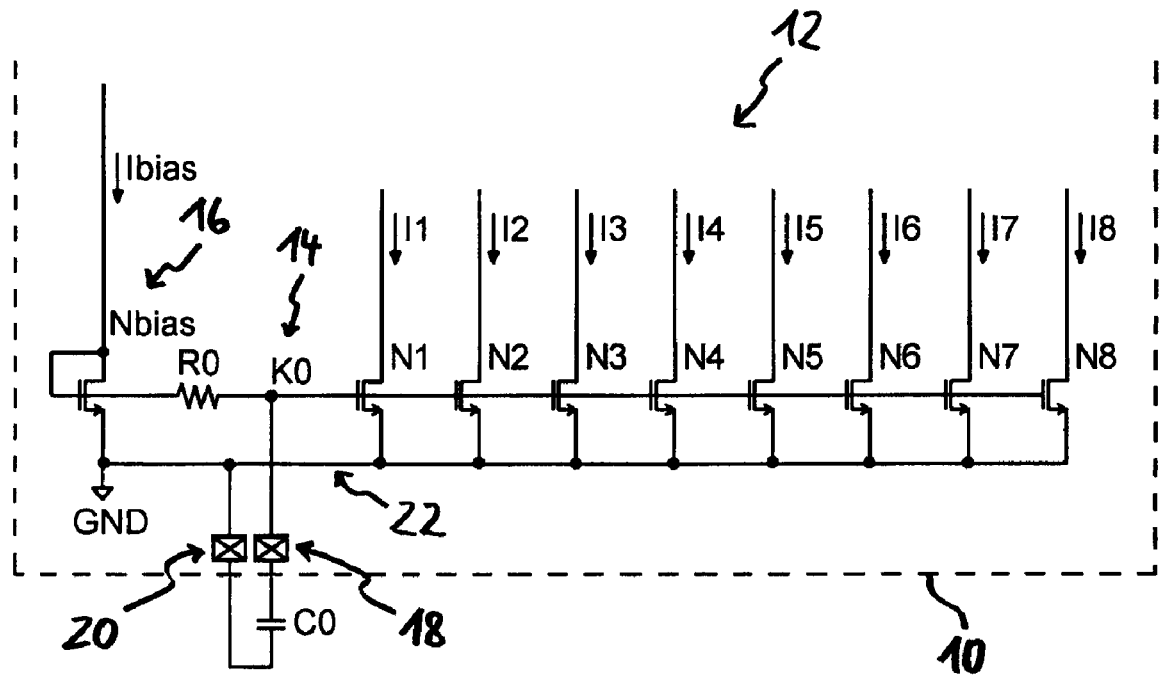
FIG. 2 a current-source arrangement that corresponds to the arrangement shown in FIG. 1, except that it shows an embodiment of the invention.

FIG. 2 shows a circuit arrangement 10 integrated in CMOS technology, comprising a digital-analogue converter (DAC) 12, of which the right-hand part of Figure 8 shows current-source transistors N1-N8 (in the present embodiment FETs), which are arranged parallel to each other, for providing current components I1-I8 that in each case are predetermined in a fixed manner.

Figure 1:
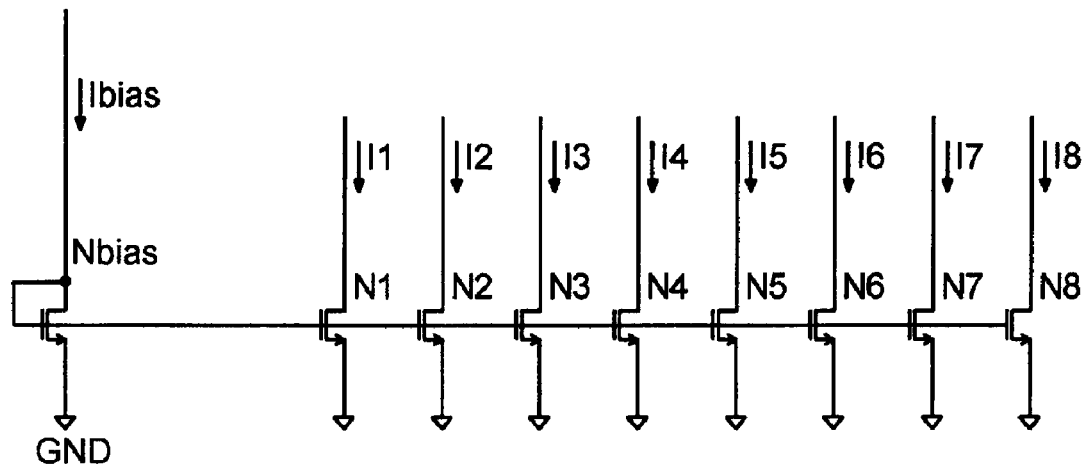
FIG. 1 a current-source arrangement of a conventional digital-analogue converter (DAC)

As already explained in the introduction with reference to FIG. 1, the gate connections of the current-source transistors N1-N8 are subjected to a common adjustment potential which defines the individual current components I1-I8 according to transistor characteristics.

The adjustment potential is provided by an adjustment circuit 16 shown in the left-hand part of the figure. In the exemplary embodiment shown, the adjustment potential is generated at the gate connection of a field effect transistor Nbias that serves as a reference current source, wherein said field effect transistor Nbias is operated in saturation, in a manner that is known per se, by a connection of its gate connection with its drain connection.

The circuit arrangement 10 comprises an external connection ("connection path") 18 which is connected to the adjustment potential line 14 by way of a circuit branch point K0, with an external capacitor C0 being connected to said external connection 18. The part which in FIG. 2 is shown within the dashed line has been produced in the corresponding production technology (in the present case CMOS technology). Consequently, in this example the external connection 18 and an external connection 20 that will be described below are produced in this technology. In contrast to this, the external capacitor C0 is, however, formed outside the substrate that provides the electronic components (FETs etc.) described above. If the circuit arrangement 10 is provided as a so-called encased chip, i.e. if the substrate is, for example, encapsulated in an epoxy sealing compound, then a preferred exemplary embodiment provides for the external capacitor C0 to be contained within the casing.

As it were, this capacitor C0 serves as a "buffer capacitor" which when the DAC 12 is in operation stabilises the potential that is present at the adjustment potential line 14 so that any interference occurring in practical application in the region of the adjustment circuit 16 and/or the adjustment potential line 14, in particular any noise in the reference current Ibias, is effectively attenuated during transmission of the adjustment potential to the current-source transistors N1-N8, and the current components I1-I8 are correspondingly provided in a significantly more stable manner.

Furthermore, a resistor R0, arranged along the adjustment potential line 14, which resistor R0 in the embodiment shown is arranged between the gate connection of the reference transistor Nbias and the circuit branch point K0, contributes to this suppression of interference.

A characteristic that in view of suppression of interference is also advantageous consists of the second connection of the capacitor C0 not being connected externally to a reference potential but by way of a further external connection 20 of the integrated circuit arrangement 10 being connected to a reference potential line 22 of the integrated circuit arrangement 10. Preferably, the further external connection 20 is connected to a section of an electrical line connection that leads from the reference transistor Nbias to the current-source transistors N1-N8 (in the present embodiment to their source connections).

Due to the external arrangement of the capacitor C0, the latter can be provided without any problem with relatively large capacitance (e.g. at least 100 nF).

FIG. 3 again shows part of the components of the DAC 12, which components are shown in FIG. 2, wherein also, by way of an example, components for generating a voltage signal Vout are shown, which represents the analogue output signal of the DAC 12.

Figure 3:
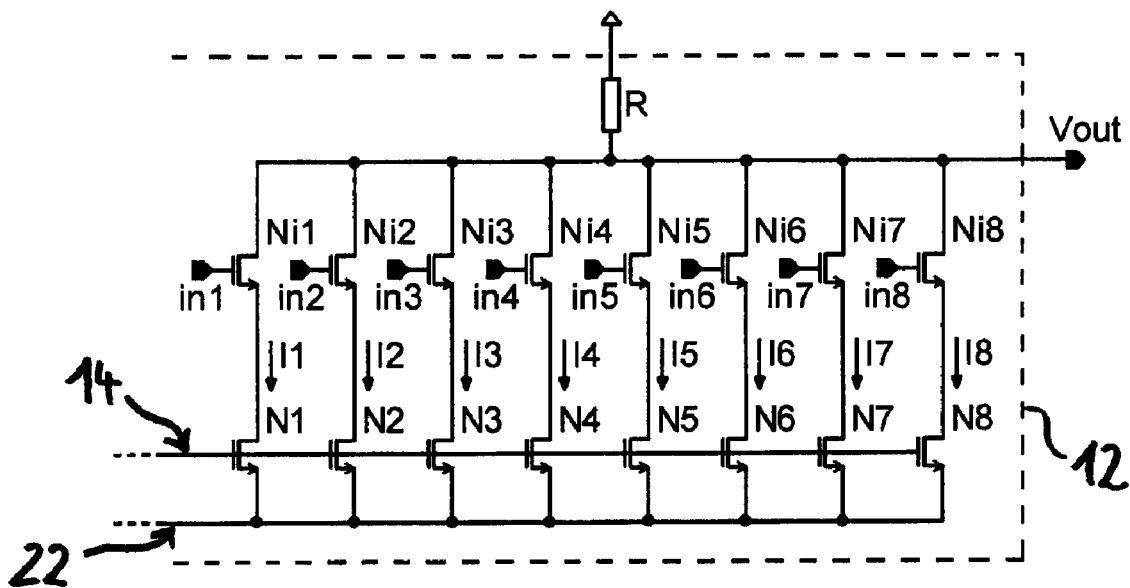
FIG. 3 an illustration to explain the provision of a DAC output signal in the form of a voltage.

As shown in FIG. 3, controllable switches in the form of digitally operated field effect transistors Ni1-Ni8 are provided, each of which are connected in series with one of the current-source transistors N1-N8. The channel connections (drain connections) of these switching transistors Ni1-Ni8, which connections face away from the transistors N1-N8, are connected to each other and to a first connection of a resistor R whose second connection is connected to a reference potential (e.g. a supply potential of the circuit arrangement).

When the DAC 12 is in operation, from the current components I1-I8 that in each case are predetermined in a fixed manner, depending on the switching states of the switching transistors Ni1-Ni8, a current fed by way of the resistor R is formed, which current corresponds to the sum of the currently switched-on current components. The converter output signal Vout as a voltage drop at the resistor R is a signal that is proportional to this total current.

In the exemplary embodiment shown, the totality of the potentials in1-in8 fed to the gate connections of the switching transistors Ni1-Ni8 represents the digital input signal of the DAC 12, which input signal is displayed according to a thermometer code. In the exemplary embodiment shown, the individual current components I1-I8 are identical due to the identical design of the current-source transistors N1-N8.

Of course, in a manner different to that of the exemplary embodiment shown, it is imaginable to use current components I1-I8 of different sizes (e.g. at a ratio of 1:2:4:8: ... ), e.g. by correspondingly graduated dimensioning of the individual transistors N1-N8, and/or to use some other type of coding for the digital input signal in1-in8.

It is essential that the adjustment potential fed in by way of the adjustment potential line 14 is stabilised in the manner described above, in order to produce particularly well-defined current components I1-I8 (irrespective of the size of these individual current components, and irrespective of the manner in which these components are used in order to from the analogue output signal).

Figure 4:
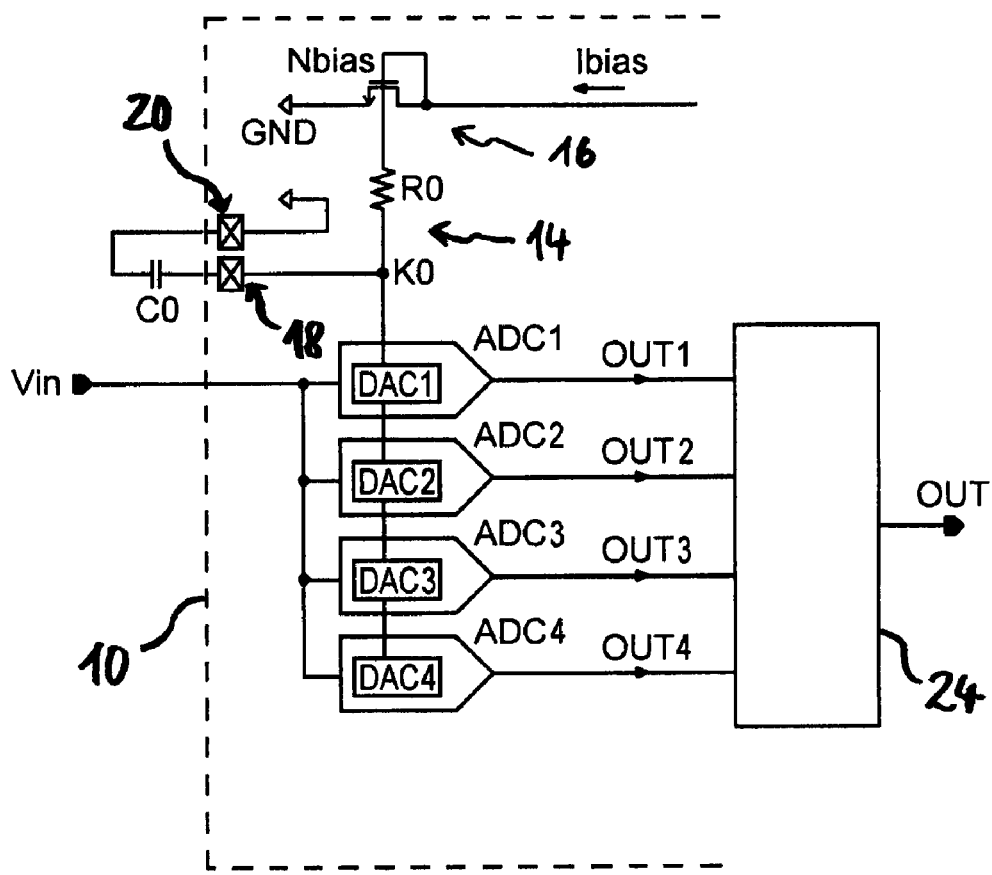
FIG. 4 an illustration to explain a preferred application of the invention.

FIG. 4 shows an exemplary embodiment of a circuit arrangement 10 for use in conjunction with an ultrasonic sensor (not shown) from which one or several analogue sensor output signals are to be evaluated by the integrated circuit arrangement 10.

The figure shows such a sensor output signal as an input signal Vin of the integrated circuit arrangement 10. For the purpose of measuring or evaluating this sensor signal Vin, the circuit arrangement 10 comprises a parallel and thus redundant arrangement of 4 analogue-digital converters ADC1-ADC4. This multitude of ADCs form 4 redundant digital presentations OUT1-OUT4 which are input to a digital processing unit 24 that averages these digital signals and outputs them as a digital output signal OUT.

The redundant arrangement of the ADCs advantageously results in a considerable reduction in the signal-to-noise ratio in the digitalisation of the sensor signal Vin. However, such an improvement in the conversion quality requires that correlated interference in the region of the ADCs be kept as low as possible. In the embodiment shown this is achieved in that the feedback arrangements of the converters ADC1-ADC4, which are designed as identical delta-sigma analogue-digital converters, in each case comprise a digital-analogue converter (DAC1-DAC4), for which feedback arrangements the above-described interference suppression by means of an external capacitor is provided.

Particularly advantageously, in this arrangement a single external capacitor C0 for stabilising an adjustment potential that is utilised by all the DACs is used. The conversion quality of these converters DAC1-DAC4 is thus in a simple manner considerably improved, which in turn in practical application renders parallel connection of the ADCs formed by them particularly beneficial.

Although for the sake of simplicity not shown in FIG. 4, further ADC arrangements can be supplied with the stabilised adjustment potential by way of the adjustment potential line 14. In this way a "multi-channel analogue-digital conversion" can be implemented in a simple manner (e.g. for processing several sensor signals).

The invention claimed is:

1. An integrated circuit arrangement comprising at least one digital-analogue converter (12) with a multitude of current-source transistors (N1-N8) arranged parallel to each other for providing current components (I1-I8) that in each case are predetermined in a fixed manner and are used to form an analogue current signal, wherein control inputs of the current-source transistors (N1-N8) can be subjected to a shared adjustment potential by way of an adjustment potential line (14), which adjustment potential defines the individual current components (I1-I8), and comprising an adjustment circuit (16) for providing the adjustment potential at the adjustment potential line (14), characterised in that the integrated circuit arrangement comprises an external connection (18), which is connected to the adjustment potential line (14), for connecting an external capacitor (C0).

2. The integrated circuit arrangement according to claim 1, comprising a further external connection (20) that is connected to a reference potential line (22) of the integrated circuit arrangement.

3. The integrated circuit arrangement according to claim 1, wherein in a section of the adjustment potential line (14), which section leads from the adjustment circuit (16) to the multitude of current-source transistors (N1-N8), a resistor element (R0) is arranged.

4. The integrated circuit arrangement according to claim 1, comprising a multitude of digital-analogue converters (DAC1-DAC4) each comprising a multitude of current-source transistors (N1-N8), wherein the adjustment circuit (16) and the adjustment potential line (14) are provided to be shared by the multitude of digital-analogue converters (DAC1-DAC4).

5. The integrated circuit arrangement according to claim 1, wherein the digital-analogue converter (12; DAC1-DAC4) is arranged in a feedback arrangement of a delta-sigma analogue-digital converter (ADC1-ADC4) formed by the integrated circuit.

6. The integrated circuit arrangement according to claim 1, comprising a multitude of delta-sigma analogue-digital converters (ADC1-ADC4), in each case comprising at least one digital-analogue converter (DAC1-DAC4) in a feedback arrangement of the delta-sigma analogue-digital converter (ADC1-ADC4), wherein the adjustment circuit (16) and the adjustment potential line (14) are provided to be shared by the multitude of digital-analogue converters (DAC1-DAC4).

7. The integrated circuit arrangement according to claim 6, wherein the multitude of delta-sigma analogue-digital converters (ADC1-ADC4) are provided for redundant analogue-digital conversion of a shared analogue input signal (Vin), and digital output signals (OUT1-OUT4) of the individual delta-sigma analogue-digital converters (ADC1-ADC4) are fed to a digital signal processing device (24) of the integrated circuit arrangement.

8. A method of using an integrated circuit arrangement according to claim 5 comprising the step of converting an analogue measuring signal (Vin) to a digital signal by use of said integrated circuit arrangement.

* * * * *

UNITED STATES PATENT AND TRADEMARK OFFICE
CERTIFICATE OF CORRECTION

PATENT NO. : 7,561,087 B2  Page 1 of 1
APPLICATION NO. : 12/099992
DATED : July 14, 2009
INVENTOR(S) : Stephan Mechnig It is certified that error appears in the above-identified patent and that said Letters Patent is hereby corrected as shown below:

On the Title page, item (73) Assignee, line 2, please delete "Unteraching" and insert therefor --Unterhaching--.

Signed and Sealed this

Twenty-ninth Day of September, 2009

David J. Kappos
*Director of the United States Patent and Trademark Office*